(12) United States Patent
Aoki et al.

(10) Patent No.: US 10,845,127 B2
(45) Date of Patent: Nov. 24, 2020

(54) COOLING DEVICE

(71) Applicants: Kabushiki Kaisha Toshiba, Minato-ku (JP); Toshiba Infrastructure Systems & Solutions Corporation, Kawasaki-shi (JP)

(72) Inventors: Kensuke Aoki, Fuchu (JP); Takuya Hongo, Yokohama (JP)

(73) Assignees: Kabushiki Kaisha Toshiba, Minato-ku (JP); Toshiba Infrastructure Systems & Solutions Corporation, Kawasaki (JP)

( * ) Notice: Subject to any disclaimer, the term of this patent is extended or adjusted under 35 U.S.C. 154(b) by 79 days.

(21) Appl. No.: 15/695,468

(22) Filed: Sep. 5, 2017

(65) Prior Publication Data

US 2017/0363365 A1    Dec. 21, 2017

Related U.S. Application Data

(63) Continuation of application No. PCT/JP2015/085034, filed on Dec. 15, 2015.

(30) Foreign Application Priority Data

Mar. 6, 2015   (JP) .................................. 2015-045166

(51) Int. Cl.
*F28D 15/02* (2006.01)
*H01L 23/427* (2006.01)
(Continued)

(52) U.S. Cl.
CPC ......... *F28D 15/0266* (2013.01); *F28D 15/02* (2013.01); *F28D 15/025* (2013.01);
(Continued)

(58) Field of Classification Search
CPC .. F28D 15/02; F28D 15/0266; F28D 15/0233; F28D 15/043; F28D 15/06;
(Continued)

(56) References Cited

U.S. PATENT DOCUMENTS

2004/0037045 A1    2/2004   Phillips et al.
2007/0273024 A1    11/2007  Madsen et al.
(Continued)

FOREIGN PATENT DOCUMENTS

CN    1995896 A      7/2007
CN    101089540 A    12/2007
(Continued)

OTHER PUBLICATIONS

International Search Report dated Mar. 15, 2016 in PCT/JP2015/085034 (with English translation).

*Primary Examiner* — Eric S Ruppert
(74) *Attorney, Agent, or Firm* — Oblon, McClelland, Maier & Neustadt, L.L.P.

(57) ABSTRACT

A cooling device of an embodiment includes an evaporator, a condenser, a first connection pipe, a second connection pipe, and a third connection pipe. A refrigerant is vaporized in the evaporator by heat generated by a heating element. The condenser is located above the evaporator, and configured to condense the vaporized refrigerant by exchanging heat with an external fluid. The first connection pipe guides the refrigerant vaporized by the evaporator to the condenser. The second connection pipe guides the refrigerant condensed by the condenser to the evaporator. The third connection pipe connects a portion of the first connection pipe and a portion of the second connection pipe. A connection position between the third connection pipe and the first (Continued)

connection pipe is higher than a maximum liquid level height of the refrigerant in the second connection pipe during an operation.

15 Claims, 7 Drawing Sheets

(51) Int. Cl.
  *H05K 7/20* (2006.01)
  *F25B 23/00* (2006.01)
(52) U.S. Cl.
  CPC ....... *H01L 23/427* (2013.01); *H05K 7/20672* (2013.01); *F25B 23/006* (2013.01); *F28F 2250/06* (2013.01); *F28F 2265/14* (2013.01)
(58) Field of Classification Search
  CPC .. F28D 15/025; H01L 23/427; F28F 2250/06; F28F 2265/14
  See application file for complete search history.

(56) References Cited

U.S. PATENT DOCUMENTS

| | | | |
|---|---|---|---|
| 2007/0289721 A1 | 12/2007 | Miyagawa et al. | |
| 2010/0061062 A1 | 3/2010 | Madsen et al. | |
| 2010/0243210 A1* | 9/2010 | Rosenfeld | F28D 15/043 |
| | | | 165/104.26 |
| 2015/0241094 A1* | 8/2015 | Blomberg | F25B 39/02 |
| | | | 62/119 |
| 2015/0369541 A1 | 12/2015 | Dupont | |

FOREIGN PATENT DOCUMENTS

| | | |
|---|---|---|
| CN | 103968573 A | 8/2014 |
| JP | 54-131876 A | 10/1979 |
| JP | 56-81597 U | 7/1981 |
| JP | 61-79773 U | 5/1986 |
| JP | 3-23604 U | 3/1991 |
| JP | 9-273876 A | 10/1997 |
| JP | 11-193980 A | 7/1999 |
| JP | 11-325766 A | 11/1999 |
| JP | 2003-318342 A | 11/2003 |
| JP | 2007-513506 A | 5/2007 |
| JP | 2008-527285 A | 7/2008 |
| JP | 4524289 B2 | 8/2010 |
| JP | 2012-241976 A | 12/2012 |
| JP | 2014-154683 A | 8/2014 |
| SU | 958795 A2 * | 9/1982 |
| WO | WO 2012/144123 A1 | 10/2012 |
| WO | WO 2014/125064 A1 | 8/2014 |

* cited by examiner

COOLING DEVICE

CROSS-REFERENCE TO RELATED APPLICATION

This is a Continuation Application of International Application PCT/JP2015/085034, filed on Dec. 15, 2015, which claims priority to Japanese Patent Application No. 2015-045166, filed Mar. 6, 2015, and the entire contents of all of which are incorporated herein by reference.

FIELD

Embodiments described herein relate generally to a cooling device.

BACKGROUND

A cooling device which cools a heating element utilizing evaporation heat of a refrigerant is known. Such a cooling device includes an evaporator in which the refrigerant is vaporized by heat generated by the heating element, a condenser which condenses the vaporized refrigerant, a first connection pipe which guides the refrigerant vaporized in the evaporator to the condenser, and a second connection pipe which guides the refrigerant condensed in the condenser to the evaporator.

Here, there are cases in which a diameter of the first connection pipe is not able to be made sufficiently large due to installation space, piping cost, or other reasons. In such a case, a phenomenon in which a part of a liquid-phase refrigerant (hereinafter referred to as a liquid refrigerant) in the evaporator is brought out to the first connection pipe and the condenser by the refrigerant vaporized in the evaporator occurs. If this phenomenon continues for more than a certain time, there are cases in which the liquid refrigerant is depleted in the evaporator and thus cooling performance of the cooling device is degraded.

DETAILED DESCRIPTION

According to one embodiment, the cooling device includes an evaporator, a condenser, a first connection pipe, a second connection pipe, and a third connection pipe. A refrigerant is vaporized in the evaporator by heat generated by a heating element. The condenser is located above the evaporator, and the vaporized refrigerant is condensed in the condenser by exchanging heat with an external fluid. The first connection pipe includes a first end portion communicating with the evaporator and a second end portion communicating with the condenser, and guides the refrigerant vaporized in the evaporator to the condenser. The second connection pipe includes a first end portion communicating with the condenser and a second end portion communicating with the evaporator, and guides the refrigerant condensed in the condenser to the evaporator. The third connection pipe connects a portion of the first connection pipe positioned between the first end portion and the second end portion of the first connection pipe and a portion of the second connection pipe positioned between the first end portion and the second end portion of the second connection pipe. A connection position between the third connection pipe and the first connection pipe is higher than a maximum liquid level height of the refrigerant in the second connection pipe when the cooling device is in operation.

Hereinafter, a cooling device of an embodiment will be described with reference to the drawings.

First, with reference to FIGS. 1 to 3, a cooling device 1 of one embodiment will be described.

Figure 1:
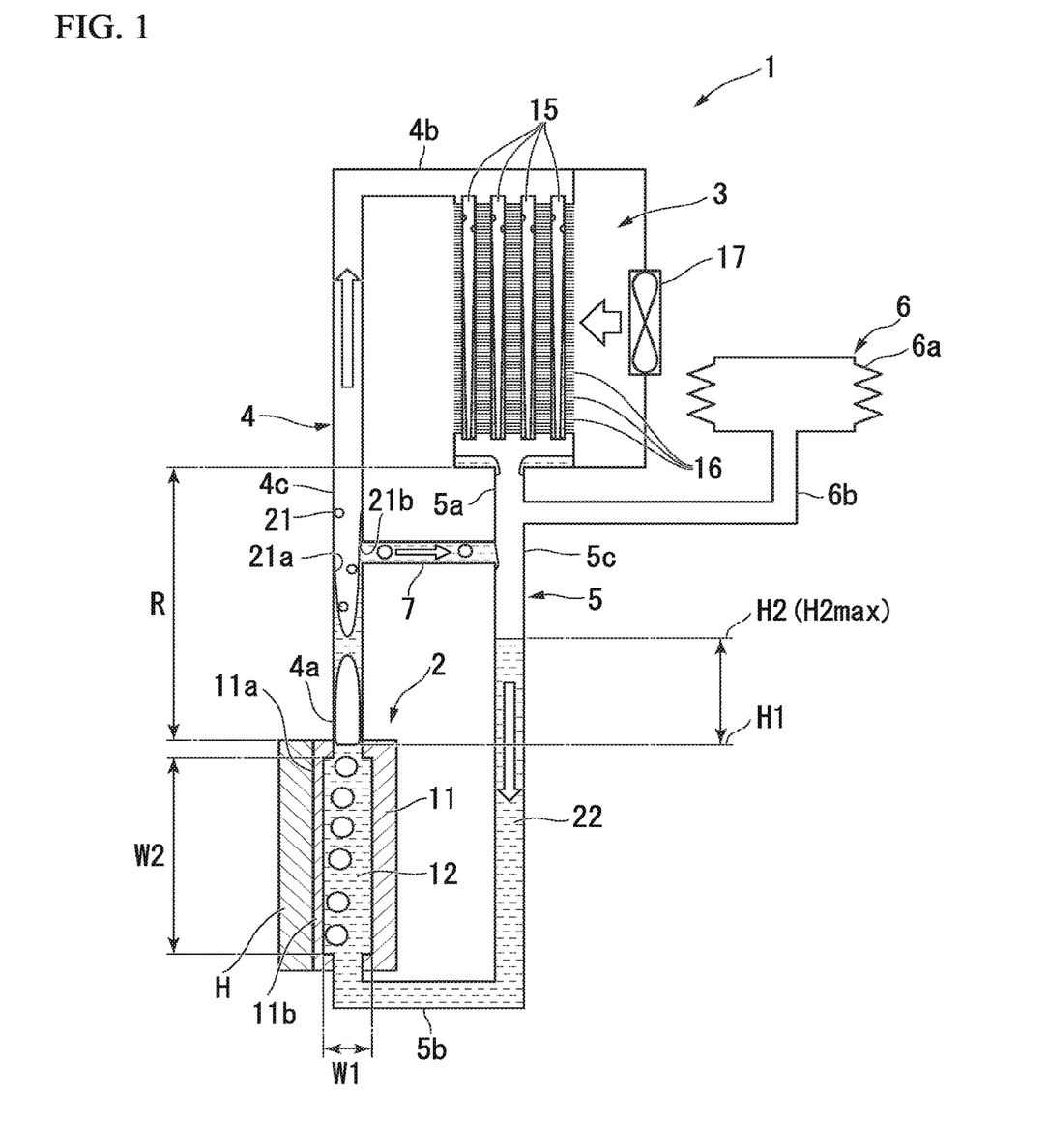
FIG. 1 is a cross-sectional view schematically showing a cooling device of an embodiment.

FIG. 1 schematically shows a configuration example of the cooling device 1. As shown in FIG. 1, the cooling device 1 is a thermosiphon type (a two-phase thermosiphon type) cooling device.

Specifically, the cooling device 1 of the present embodiment includes an evaporator 2 in which a refrigerant is vaporized, a condenser 3 in which the evaporated refrigerant is condensed, a first connection pipe 4 which guides the refrigerant vaporized in the evaporator 2 to the condenser 3, a second connection pipe 5 which guides the refrigerant condensed in the condenser 3 to the evaporator 2, an expansion tank 6 connected to the second connection pipe 5, and a third connection pipe 7 which connects a portion of the first connection pipe 4 and a portion of the second connection pipe 5.

First, the evaporator 2 will be described.

The evaporator 2 includes a case 11 and a space (a storage portion, an accommodating portion) 12 provided inside the case 11. The case 11 is formed of a material having high thermal conductivity such as a metal.

The case 11 is thermally connected to a heating element H that is a cooling target. For example, the case 11 is arranged in a horizontal direction with respect to the heating element H. For example, a surface of the case 11 (for example, a side surface 11a of the case 11) is in contact with the heating element H. For example, the side surface 11a of the case 11 is formed to have substantially the same size as a main surface (a surface having the largest area) of the heating element H.

The outer shape of the heating element H is a plate shape, for example. An example of the heating element H is a power amplifier which amplifies a radio signal for broadcast output from a transmitter used in a broadcast station or the like. Further, the cooling device 1 of the present embodiment can be widely applied to various heating elements H. The heating element H to which the cooling device 1 is applicable is not particularly limited.

The space 12 is configured to accommodate the refrigerant. The refrigerant is supplied to the cooling device 1 to sufficiently fill the space 12 when the cooling device 1 is stopped. Here, types of the refrigerant are not particularly limited. For example, the refrigerant is a fluid having a boiling point lower than that of water. For example, the refrigerant is a fluid having a boiling point of approximately 50° C. The refrigerant in the evaporator 2 receives heat generated by the heating element H. Thereby, the refrigerant is vaporized in the evaporator 2 and becomes vapor. The vaporized refrigerant moves upward from the space 12.

Here, the case 11 of the present embodiment includes a partition wall 11b between the heating element H and the space 12. Thus, the refrigerant in the space 12 receives heat from the heating element H via the partition wall 11b of the case 11. Further, the case 11 may have an opening that opens toward the heating element H. That is, the refrigerant in the space 12 may be directly in contact with the heating element H through the opening of the case 11.

As shown in FIG. 1, the evaporator 2 of the present embodiment is a so-called vertical type evaporator. That is, a width W1 of the space 12 in a horizontal direction in which the case 11 and the heating element H are arranged is smaller than a width W2 of the space 12 in a vertical direction.

Next, the condenser 3 will be described.

The condenser 3 includes a plurality of cooling pipes 15, a plurality of fins 16 attached to the cooling pipes 15, and a fan 17 for blowing air toward the plurality cooling pipes 15 and the plurality fins 16.

Specifically, each of the plurality of cooling pipes 15 extends in the vertical direction. The plurality of cooling pipes 15 are arranged in the horizontal direction. Inlets of the plurality of cooling pipes 15 are combined into one. Similarly, outlets of the plurality of cooling pipes 15 are combined into one.

The plurality of fins 16 are attached to the plurality of cooling pipes 15.

The fan 17 blows air toward the plurality of cooling pipes 15 and the plurality of fins 16. Thereby, the fan 17 cools the plurality of cooling pipes 15 and the plurality of fins 16.

The condenser 3 is located above the evaporator 2. The refrigerant vaporized in the evaporator 2 is introduced into the condenser 3. The refrigerant introduced into the condenser 3 is divided to be introduced into the plurality of cooling pipes 15. The refrigerant introduced into the cooling pipes 15 is condensed in the process of passing through the cooling pipes 15 by exchanging heat with an external fluid (for example, air) via the cooling pipes 15 and the fins 16. Further, the condenser 3 is not limited to the above configuration. The condenser 3 may be a condenser having no fan 17 (a condenser with natural air cooling), for example.

Next, the first connection pipe 4 will be described.

The first connection pipe (vapor pipe) 4 is provided between the evaporator 2 and the condenser 3, and connects the evaporator 2 and the condenser 3. Specifically, the first connection pipe 4 includes a first end portion 4a and a second end portion 4b. The first end portion 4a of the first connection pipe 4 is connected to an upper end portion of the evaporator 2 (an upper end portion of the case 11) and communicates with the evaporator 2. That is, the first connection pipe 4 communicates with an upper end portion of the space 12 of the evaporator 2. The second end portion 4b of the first connection pipe 4 is connected to an upper end portion of the condenser 3 and communicates with the condenser 3. The first connection pipe 4 communicates with the inlets of the plurality of cooling pipes 15 that are combined into one. The refrigerant vaporized in the evaporator 2 is introduced into the first connection pipe 4. The first connection pipe 4 guides the refrigerant vaporized in the evaporator 2 to the condenser 3.

In addition, the first connection pipe 4 includes a portion 4c positioned between the first end portion 4a and the second end portion 4b. The portion 4c of the first connection pipe 4 includes an upward piping portion 21 extending upward from the evaporator 2. The upward piping portion 21 extends, for example, in a substantially vertical direction. The upward piping portion 21 includes an inner circumferential surface 21a extending upward.

Next, the second connection pipe 5 will be described.

As shown in FIG. 1, the second connection pipe (liquid pipe) 5 is provided between the condenser 3 and the evaporator 2, and connects the condenser 3 and the evaporator 2. Specifically, the second connection pipe 5 includes a first end portion 5a and a second end portion 5b. The first end portion 5a of the second connection pipe 5 is connected to a lower end portion of the condenser 3 and communicates with the condenser 3. The second connection pipe 5 communicates with the outlets of the plurality of cooling pipes 15 that are combined into one. The second end portion 5b of the second connection pipe 5 is connected to a lower end portion of the evaporator 2 and communicates with the evaporator 2. That is, the second connection pipe 5 communicates with a lower end portion of the space 12 of the evaporator 2. The refrigerant condensed in the condenser 3 is introduced into the second connection pipe 5. The second connection pipe 5 guides the refrigerant condensed in the condenser 3 to the evaporator 2.

In addition, the second connection pipe 5 includes a portion 5c positioned between the first end portion 5a and the second end portion 5b. The portion 5c of the second connection pipe 5 includes a downward piping portion 22 extending downward from the condenser 3. The downward piping portion 22 extends, for example, in a substantially vertical direction. The cooling device 1 includes a portion R in which the downward piping portion 22 of the second connection pipe 5 and the upward piping portion 21 of the first connection pipe 4 extend substantially in parallel.

Here, the cooling device 1 of the present embodiment is a thermosiphon type cooling device. That is, the refrigerant condensed in the condenser 3 is introduced into the second connection pipe 5 due to gravity and returns to the evaporator 2. Thereby, the cooling device 1 can circulate the refrigerant without having a pump.

As described above, the cooling device 1 circulates the refrigerant between the evaporator 2 and the condenser 3. That is, in the cooling device 1, the evaporator 2 moves heat from the heating element H to the refrigerant and the condenser 3 discharges heat from the refrigerant to the outside. Thereby, the cooling device 1 cools the heating element H.

Next, the expansion tank 6 will be described.

The expansion tank 6 is an example of a "tank." The expansion tank 6 includes a container 6a which is expandable and contractible according to a change in air pressure and an introduction pipe 6b which forms a connection port of the container 6a.

In the present embodiment, the expansion tank 6 is connected to the second connection pipe 5. For example, the expansion tank 6 is connected to the downward piping portion 22 of the second connection pipe 5.

The expansion tank 6 expands according to air pressure in the second connection pipe 5. That is, the expansion tank 6 expands in a case where the air pressure in the second connection pipe 5 is higher than a certain reference value. On the other hand, the expansion tank 6 contracts as the air pressure in the second connection pipe 5 decreases from a state in which the air pressure is higher than the reference value toward the reference value. Thus, the expansion tank 6 has a function of suppressing change in air pressure in the second connection pipe 5.

As shown in FIG. 1, a connection position between the expansion tank 6 and the second connection pipe 5 is lower than the condenser 3.

In addition, the connection position between the expansion tank 6 and the second connection pipe 5 is higher than a liquid level height H2 of the refrigerant in the second connection pipe 5. More specifically, the connection position between the expansion tank 6 and the second connection pipe 5 is higher than a maximum liquid level height H2max of the refrigerant in the second connection pipe 5 when the cooling device 1 is in operation. Thereby, the expansion tank 6 can expand or contract according to the air pressure inside the second connection pipe 5 even when the refrigerant in the second connection pipe 5 reaches the maximum liquid level height H2max. In addition, the term "operation" as used in the present application means that the refrigerant circulates with vaporization and condensation in the cooling device 1. Further, the maximum liquid level height H2max of the refrigerant will be described later.

Next, the third connection pipe 7 will be described.

The third connection pipe (bypass pipe) 7 is provided between the first connection pipe 4 and the second connection pipe 5. The third connection pipe 7 connects the portion 4c positioned between the first end portion 4a and the second end portion 4b in the first connection pipe 4 and the portion 5c positioned between the first end portion 5a and the second end portion 5b in the second connection pipe 5. One end portion of the third connection pipe 7 is connected to a part of the upward piping portion 21 of the first connection pipe 4. The other end portion of the third connection pipe 7 is connected to a part of the downward piping portion 22 of the second connection pipe 5.

The third connection pipe 7 connects the upward piping portion 21 and the downward piping portion 22, for example, in the portion R in which the upward piping portion 21 and the downward piping portion 22 are arranged substantially in parallel. In the present embodiment, the third connection pipe 7 extends in a substantially horizontal direction between the upward piping portion 21 and the downward piping portion 22. Thereby, the third connection pipe 7 connects the upward piping portion 21 and the downward piping portion 22 at the shortest distance.

In the first connection pipe 4, there are cases in which a part of a liquid refrigerant in the evaporator 2 is pushed up by the refrigerant vaporized in the evaporator 2. The third connection pipe 7 allows at least a part of the liquid refrigerant pushed up into the first connection pipe 4 to flow from the first connection pipe 4 into the second connection pipe 5. That is, the third connection pipe 7 allows at least a part of the liquid refrigerant pushed up into the first connection pipe 4 to flow into the second connection pipe 5 more quickly than in a case in which it passes the condenser 3. The liquid refrigerant introduced into the second connection pipe 5 through the third connection pipe 7 can return from the second connection pipe 5 to the evaporator 2.

Figure 2:
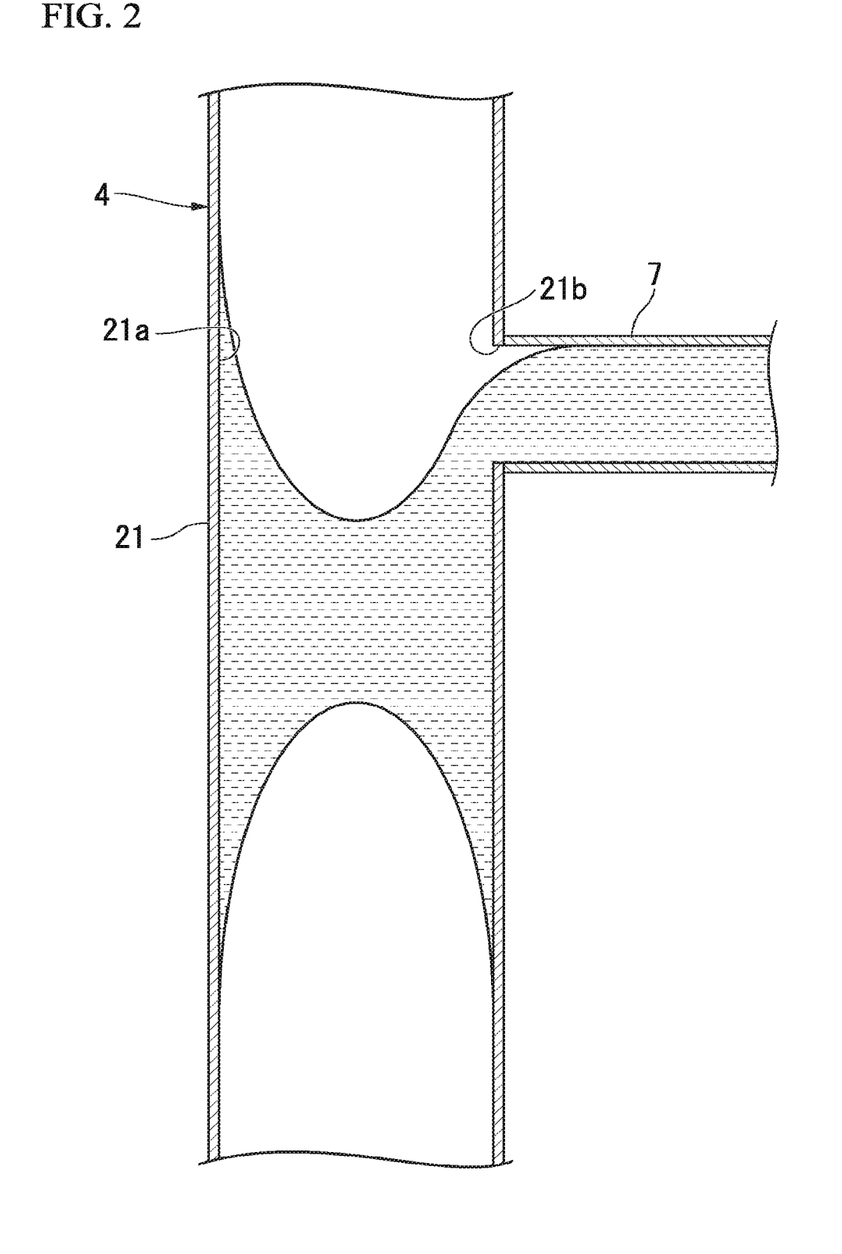
FIG. 2 is a cross-sectional view showing a connection portion between a third connection pipe and a first connection pipe which are shown in FIG. 1.

Specifically, FIG. 2 shows a connection portion between the third connection pipe 7 and the first connection pipe 4. As shown in FIG. 2, the liquid refrigerant pushed up into the first connection pipe 4 is pushed toward the inner circumferential surface 21a of the upward piping portion 21 because of a large amount of refrigerant vapor and rises in the first connection pipe 4 while contacting the inner circumferential surface 21a.

In the present embodiment, an opening 21b which is opened in a radial direction of the first connection pipe 4 is provided on the inner circumferential surface 21a of the upward piping portion 21. The third connection pipe 7 is connected to the opening 21b.

If the opening 21b is provided on the inner circumferential surface 21a of the upward piping portion 21 as described above, the liquid refrigerant which is pushed toward the inner circumferential surface 21a of the upward piping portion 21 by the refrigerant vapor and rises while contacting the inner circumferential surface 21a is pushed into the third connection pipe 7 when it reaches the opening 21b. Thereby, the liquid refrigerant easily enters the third connection pipe 7.

Next, states of the cooling device 1 when the cooling device 1 is stopped and in operation will be described.

Figure 3:
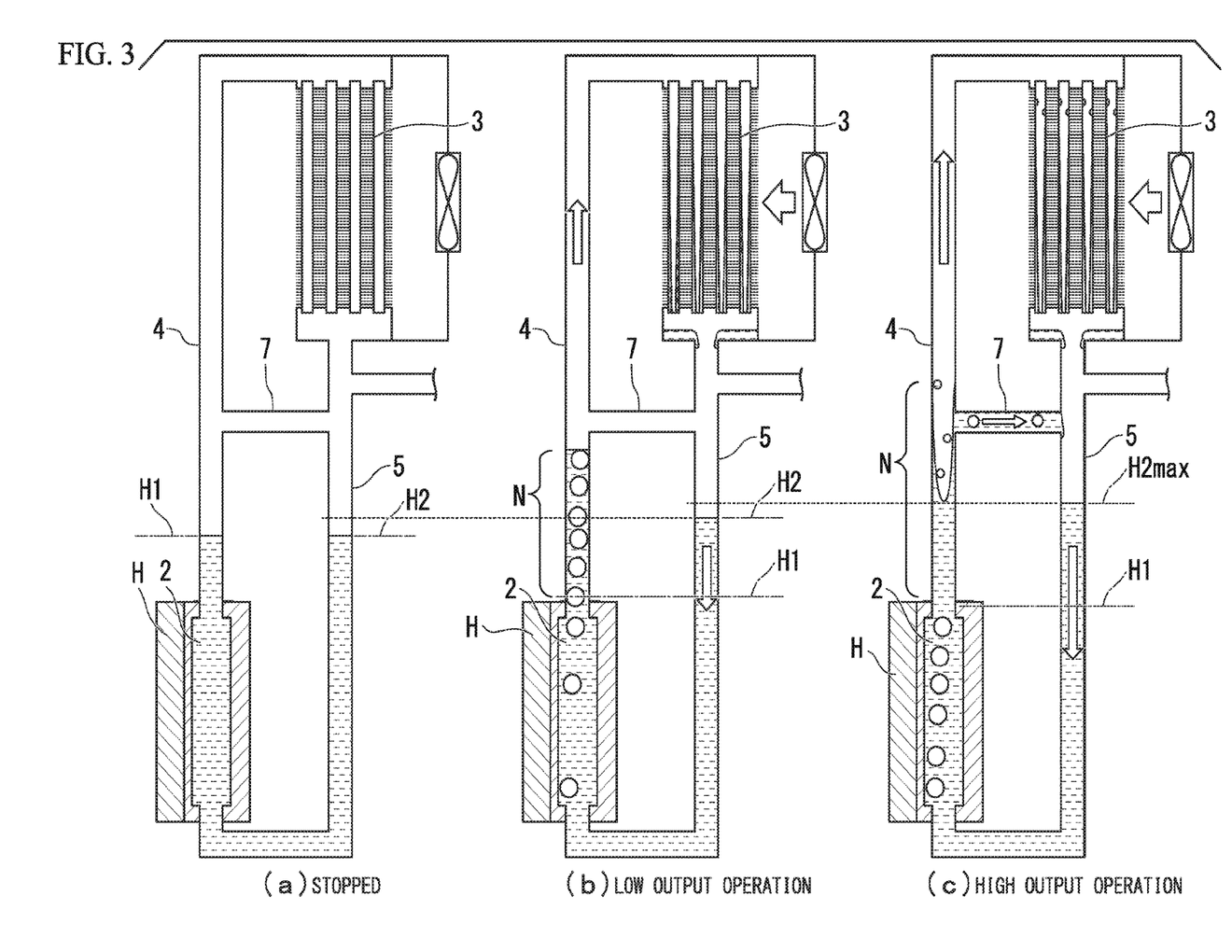
FIG. 3 is a cross-sectional view schematically showing states of the cooling device shown in FIG. 1 when the cooling device is stopped and in operation.

FIG. 3 schematically shows states of the cooling device 1 when the cooling device 1 is stopped and in operation. (a) in FIG. 3 shows a state in which the cooling device 1 is stopped. (b) in FIG. 3 shows a state in which the cooling device 1 is in a low output operation (when a heat generation rate of the heating element H is relatively low). (c) in FIG. 3 shows a state in which the cooling device 1 is in a high output operation (when a heat generation rate of the heating element H is relatively high). In addition, a region N of the first connection pipe 4 shown in FIG. 3 is a region which is not regarded as the liquid refrigerant because most thereof is filled with bubbles although a part of the liquid refrigerant is present.

As shown in (a) in FIG. 3, a sufficient amount of the refrigerant to fill the evaporator 2 is stored in the cooling device 1 when the cooling device 1 is stopped. When the cooling device 1 is stopped, the liquid level height H2 of the refrigerant in the second connection pipe 5 and the liquid level height H1 of the refrigerant in the first connection pipe 4 are balanced by gravity and are substantially at the same height.

As shown in (b) in FIG. 3, the refrigerant in the evaporator 2 is vaporized in a state in which the cooling device 1 is in operation. However, vaporization of the refrigerant at the time of the low output operation is a mild state as compared with that at the time of the high output operation to be described below. Therefore, the liquid refrigerant in the evaporator 2 is not pushed up to a relatively high position in the first connection pipe 4 by the refrigerant vaporized in the evaporator 2.

In this state at the time of the low output operation, the refrigerant vaporized in the evaporator 2 moves to the condenser 3 through the first connection pipe 4. The refrigerant that has moved to the condenser 3 is condensed in the condenser 3. The condensed refrigerant is introduced into the second connection pipe 5 as a liquid refrigerant. The liquid refrigerant introduced into the second connection pipe 5 accumulates in the second connection pipe 5. As a result, the liquid level height H2 of the refrigerant in the second connection pipe 5 becomes higher as compared with the case in which the cooling device 1 is stopped.

At this time, the region N in the first connection pipe 4 is occupied by bubbles of the refrigerant vaporized by the evaporator 2. Therefore, the substantial liquid level height H1 of the refrigerant in the first connection pipe 4 is lower as compared with the case in which the cooling device 1 is stopped. Therefore, due to a difference between the liquid level height H2 of the refrigerant in the second connection pipe 5 and the liquid level height H1 of the refrigerant in the first connection pipe 4, a driving force for moving the refrigerant in the second connection pipe 5 toward the evaporator 2 is generated in the cooling device 1.

On the other hand, as shown in (c) in FIG. 3, in the state in which the cooling device 1 is in the high output operation, evaporation of the refrigerant becomes active in the evaporator 2. Therefore, a part of the liquid refrigerant in the evaporator 2 is pushed up to a high position in the first connection pipe 4 due to the refrigerant vaporized in the evaporator 2. A part of the liquid refrigerant pushed up into the first connection pipe 4 reaches the condenser 3.

Also, when evaporation of the refrigerant in the evaporator 2 becomes active, more vapor moves from the evaporator 2 to the condenser 3. Then, the vapor is condensed by the condenser 3 and is introduced into the second connection pipe 5. Therefore, an amount of the liquid refrigerant introduced into the second connection pipe 5 increases. As a result, the liquid level height H2 of the refrigerant in the second connection pipe 5 is often higher as compared with the case in which the cooling device 1 is in the low output operation of the cooling device 1. In the cooling device 1 of the present embodiment, the liquid level height H2 of the refrigerant in the second connection pipe 5 becomes the maximum liquid level height H2max in a state in which the cooling device 1 is in a maximum output operation.

According to the cooling device 1 configured as described above, it is possible to suppress degradation of cooling performance.

That is, if the first connection pipe 4 is sufficiently thick in the cooling device 1, the liquid refrigerant in the evaporator 2 cannot easily be pushed up into the first connection pipe 4 by the vapor vaporized in the evaporator 2.

However, there are cases in which a diameter of the first connection pipe 4 cannot be made sufficiently large due to installation space, piping cost, or other reasons. In such a case, a phenomenon in which a part of the liquid refrigerant in the evaporator 2 is brought out to the first connection pipe 4 and the condenser 3 by the vapor vaporized in the evaporator 2 occurs. When this phenomenon continues for more than a certain time, there are cases in which the liquid refrigerant is depleted in the evaporator 2 and the cooling performance of the cooling device 1 is degraded. For example, when the liquid refrigerant is depleted in the evaporator 2, a temperature of the evaporator 2 continues to rise beyond a boiling point of the refrigerant.

In order to solve this phenomenon, it is conceivable to provide a vapor-liquid separation structure in the evaporator 2. However, when the vapor-liquid separation structure is provided in the evaporator 2, the size of the evaporator 2 is increased, the structure is complicated, and pressure loss thereof is increased.

Therefore, the cooling device 1 of the present embodiment has the following configuration. That is, the cooling device 1 of the present embodiment includes the evaporator 2, the condenser 3, the first connection pipe 4, the second connection pipe 5, and the third connection pipe 7. In the evaporator 2, the refrigerant is vaporized by heat generated by the heating element H. The condenser 3 is located above the evaporator 2. In the condenser 3, vaporized refrigerant is condensed by exchanging heat with an external fluid. The first connection pipe 4 guides the refrigerant vaporized in the evaporator 2 to the condenser 3. The second connection pipe 5 guides the refrigerant condensed in the condenser 3 to the evaporator 2. The third connection pipe 7 connects the portion 4c of the first connection pipe 4 and the portion 5c of the second connection pipe 5.

According to such a configuration, at least a part of the liquid refrigerant pushed up into the first connection pipe 4 by the refrigerant vaporized in the evaporator 2 can be introduced into the second connection pipe 5 through the third connection pipe 7. Thereby, the liquid refrigerant pushed up into the first connection pipe 4 can be quickly returned to the evaporator 2. Thereby, it is possible to suppress depletion of the liquid refrigerant in the evaporator 2. Thereby, it is possible to suppress degradation of the cooling performance of the cooling device 1 without providing a vapor-liquid separation structure.

Particularly, in the present embodiment, the connection position between the third connection pipe 7 and the first connection pipe 4 is higher than the maximum liquid level height H2max in the second connection pipe 5 when the cooling device 1 is in operation. According to such a configuration, even when the liquid refrigerant reaches the maximum liquid level height H2max in the second connection pipe 5, it is possible to suppress backflow of the liquid refrigerant in the second connection pipe 5 to the first connection pipe 4 through the third connection pipe 7. Thereby, the liquid refrigerant can be more reliably returned from the second connection pipe 5 to the evaporator 2. Thereby, it is possible to further suppress degradation of the cooling performance of the cooling device 1.

Figure 6:
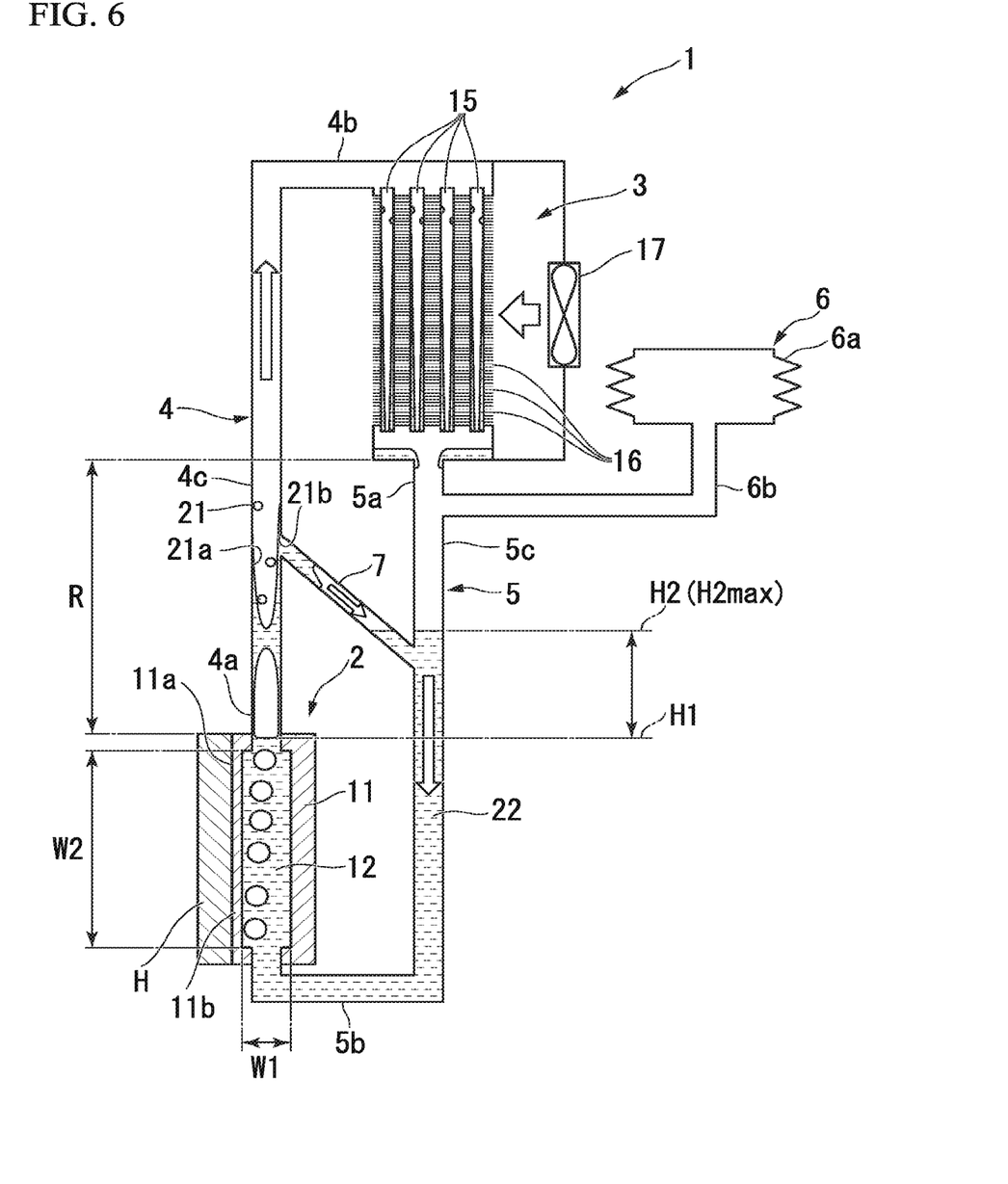
FIG. 6 is a cross-sectional view schematically showing a cooling device of a third modified example of the cooling device shown in FIG. 1.

Here, the connection position between the third connection pipe 7 and the second connection pipe 5 may be lower than the liquid level height H2 of the refrigerant in the second connection pipe 5, as a modified example shown in FIG. 6. Even in such a configuration, at least a part of the liquid refrigerant pushed up into the first connection pipe 4 can be returned to the evaporator 2 through the third connection pipe 7.

However, in such a configuration, a part of the liquid refrigerant condensed in the condenser 3 and accumulated in the second connection pipe 5 is also introduced into the third connection pipe 7 from the second connection pipe 5. Therefore, the liquid level height H2 of the refrigerant in the second connection pipe 5 is less likely to be higher than in a case in which the liquid refrigerant condensed in the condenser 3 is accumulated only in the second connection pipe 5. As a result, the driving force for circulating the refrigerant cannot easily increase in the cooling device 1.

Therefore, in the present embodiment, the connection position between the third connection pipe 7 and the second connection pipe 5 is at a position that is at least higher than the liquid level height H2 of the refrigerant in the second connection pipe 5 when the cooling device 1 is stopped. Thereby, the liquid refrigerant condensed in the condenser 3 and accumulated in the second connection pipe 5 is not introduced into the third connection pipe 7 at least until the liquid level height H2 in the second connection pipe 5 reaches the connection position between the third connection pipe 7 and the second connection pipe 5. Therefore, the liquid refrigerant easily accumulates to a relatively high position in the second connection pipe 5. Therefore, it is possible to increase the driving force for circulating the refrigerant in the cooling device 1. Thereby, the liquid refrigerant can be more efficiently returned to the evaporator 2. As a result, it is possible to further suppress degradation of the cooling performance of the cooling device 1.

In the present embodiment, the connection position between the third connection pipe 7 and the second connection pipe 5 is higher than the maximum liquid level height H2max of the refrigerant in the second connection pipe 5 when the cooling device 1 is in operation. Thereby, the liquid refrigerant easily accumulates to a higher position in the second connection pipe 5. Therefore, it is possible to further increase the driving force for circulating the refrigerant in the cooling device 1. As a result, it is possible to further suppress degradation of the cooling performance of the cooling device 1.

Next, a position of the third connection pipe 7 with respect to the condenser 3 will be described.

Here, when the connection position between the third connection pipe 7 and the second connection pipe 5 is at the same level as the condenser 3 or higher than the condenser 3, there is a possibility of the liquid refrigerant introduced into the second connection pipe 5 from the third connection pipe 7 being introduced into the condenser 3 from the second connection pipe 5. When the liquid refrigerant is introduced into the condenser 3, a function of the condenser 3 for condensing the vapor may be degraded.

On the other hand, in the present embodiment, the connection position between the third connection pipe 7 and the second connection pipe 5 is lower than the condenser 3. According to such a configuration, it is possible to suppress the liquid refrigerant introduced into the second connection pipe 5 from the third connection pipe 7 from flowing backward to the condenser 3.

Also, the connection position of the third connection pipe 7 and the first connection pipe 4 may be at the same level as the condenser 3 or higher than the condenser 3. Even in such a configuration, at least a part of the liquid refrigerant pushed up into the first connection pipe 4 can be introduced into the second connection pipe 5. Therefore, even with the above-described configuration, it is possible to suppress degradation of the cooling performance of the cooling device 1.

However, in this case, a distance between the evaporator 2 and the third connection pipe 7 is relatively largely separated. Therefore, it may take time to return the liquid refrigerant pushed up into the first connection pipe 4 to the evaporator 2. In this case, it is necessary to increase an amount of the refrigerant to be input at the time of installation of the cooling device 1 so that the liquid refrigerant is not depleted in the evaporator 2. Therefore, this may cause an increase in the size of the cooling device 1.

Therefore, in the present embodiment, the connection position between the third connection pipe 7 and the first connection pipe 4 is lower than the condenser 3. According to such a configuration, the refrigerant pushed up into the first connection pipe 4 can be quickly returned to the evaporator 2. Thereby, it is possible to reduce the amount of refrigerant required to be input at the time of installation of the cooling device 1. Thereby, it is possible to reduce the size of the cooling device 1.

Here, a position of the third connection pipe 7 with respect to the expansion tank 6 will be described.

When the connection position between the third connection pipe 7 and the second connection pipe 5 is assumed to be at the same level as or higher than the connection position between the second connection pipe 5 and the expansion tank 6, the liquid refrigerant introduced into the second connection pipe 5 from the third connection pipe 7 may be introduced into the expansion tank 6 from the second connection pipe 5. When the liquid refrigerant is introduced into the expansion tank 6, there is a possibility of an operation of the expansion tank 6, which suppresses the change of the air pressure in the second connection pipe 5, being weakened.

On the other hand, in the present embodiment, the connection position between the third connection pipe 7 and the second connection pipe 5 is lower than the connection position between the second connection pipe 5 and the expansion tank 6. According to this configuration, the liquid refrigerant introduced from the third connection pipe 7 into the second connection pipe 5 can be suppressed from being introduced into the expansion tank 6 from the second connection pipe 5. Thereby, the expansion tank 6 can function more reliably.

In a case in which an expansion tank that absorbs pressure variation by introducing the liquid refrigerant is employed as the expansion tank 6, the expansion tank 6 may be provided below the third connection pipe 7.

In the present embodiment, an inner diameter of the third connection pipe 7 is equal to or greater than a minimum inner diameter at which the temperature of the evaporator 2 does not continue to rise beyond the boiling point of the refrigerant. According to such a configuration, in the liquid refrigerant pushed up into the first connection pipe 4, a sufficient amount of the liquid refrigerant for suppressing the liquid refrigerant from being depleted in the evaporator 2 can be introduced into the second connection pipe 5. Thereby, it is possible to further suppress degradation of the cooling performance of the cooling device 1.

In the present embodiment, the inner diameter of the third connection pipe 7 is equal to or smaller than a maximum inner diameter at which the vaporized refrigerant does not form a continuous phase in the third connection pipe 7. According to such a configuration, it is possible to suppress the vapor flowing in the first connection pipe 4 from being excessively introduced into the third connection pipe 7. Thus, most of the vapor vaporized by the evaporator 2 can be moved to the condenser 3. Thereby, it is possible to more reliably maintain the cooling function of the cooling device 1.

In the present embodiment, the evaporator 2 includes the space 12 capable of accommodating the refrigerant. The first connection pipe 4 communicates with the upper end portion of the space 12. The second connection pipe 5 communicates with the lower end portion of the space 12. The width W1 of the space 12 in the horizontal direction in which the heating element H and the case 11 are arranged is smaller than the width W2 of the space 12 in the vertical direction of the space 12. That is, the evaporator 2 of the present embodiment is a vertical type evaporator.

Since an interface area between a liquid phase and a vapor phase inside the evaporator 2 is small in such a vertical type evaporator 2, the liquid refrigerant in the evaporator 2 is easily brought out to the first connection pipe 4 due to the vaporized refrigerant. That is, it can be said that the third connection pipe 7 of the present embodiment is particularly effective in the cooling device 1 having such a vertical type evaporator 2. However, even in the cooling device 1 in which the width W1 of the space 12 in the horizontal direction is greater than the width W2 of the space 12 in the vertical direction, the third connection pipe 7 of the present embodiment can suppress degradation of the cooling performance of the cooling device 1 by causing the refrigerant pushed up into the first connection pipe 4 to be quickly returned to the evaporator 2.

In the present embodiment, the first connection pipe 4 includes the inner circumferential surface 21a extending upward. The inner circumferential surface 21a includes the opening 21b which is opened in a radial direction of the first connection pipe 4 at a position higher than the evaporator 2 and is connected to the third connection pipe 7.

According to such a configuration, the liquid refrigerant which is pushed toward the inner circumferential surface 21a of the upward piping portion 21 due to the large refrigerant vapor and rises in the first connection pipe 4 while contacting the inner circumferential surface 21a reaches the opening 21b and is pushed into the third connection pipe 7. Thereby, the liquid refrigerant is easily introduced into the third connection pipe 7.

Next, several modified examples of the above embodiment will be described. In the following modified examples, the same or similar configurations as in the above embodiment will be referenced by the same reference signs.

First Modified Example

Figure 4:
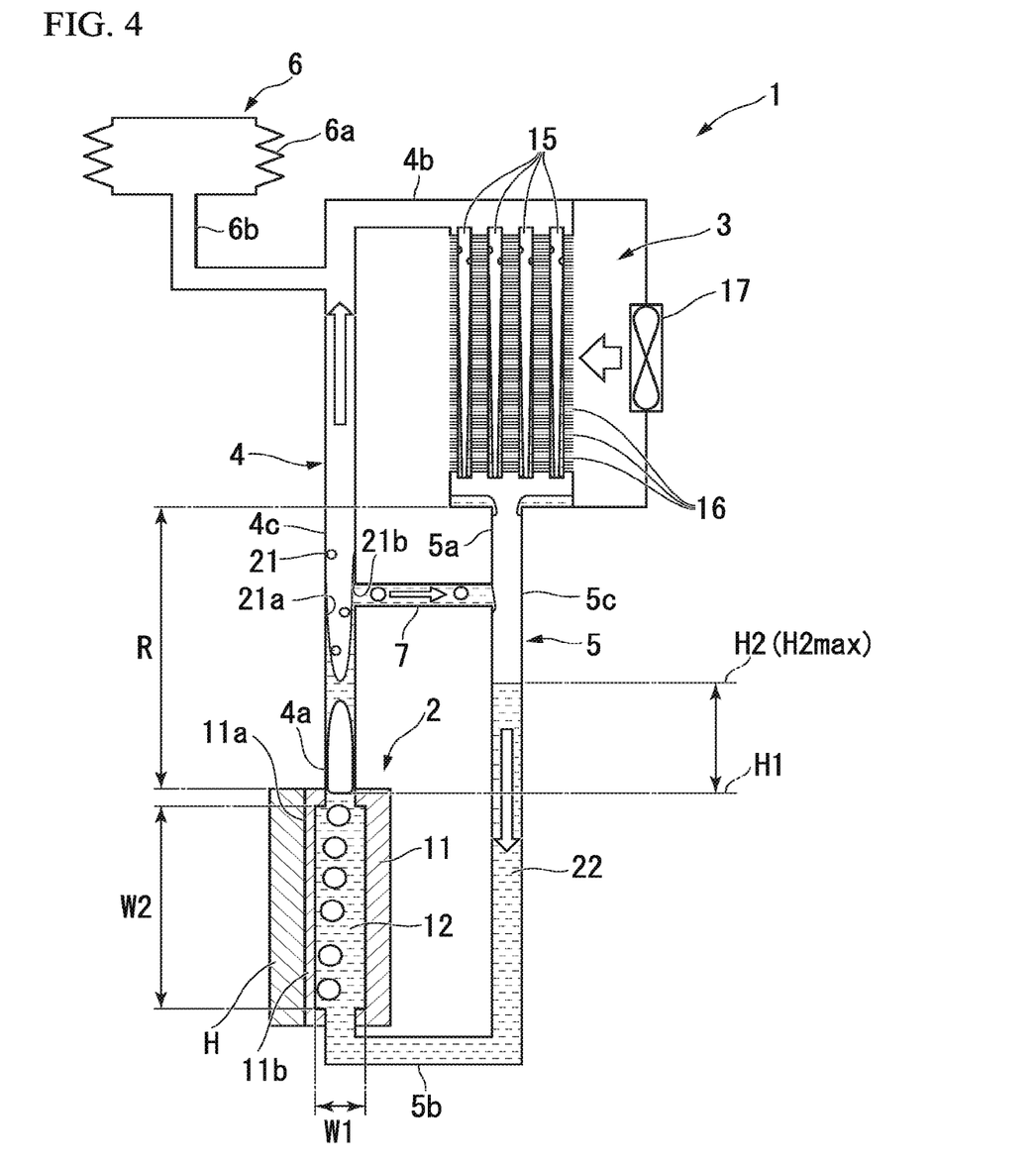
FIG. 4 is a cross-sectional view schematically showing a cooling device of a first modified example of the cooling device shown in FIG. 1.

FIG. 4 schematically shows the cooling device 1 of a first modified example. In the present modified example, a position of the expansion tank 6 is different from the above embodiment. Other configurations of the present modified example are the same as those of the above embodiment. Thus, description of parts similar to the above embodiment will be omitted.

As shown in FIG. 4, the expansion tank 6 of the present modified example is connected to the first connection pipe 4. The expansion tank 6 is expandable according to an air pressure in the first connection pipe 4.

The connection position between the third connection pipe 7 and the first connection pipe 4 is lower than a connection position between the expansion tank 6 and the first connection pipe 4.

According to such a configuration, before the liquid refrigerant pushed up into the first connection pipe 4 reaches the expansion tank 6, the liquid refrigerant can be introduced into the third connection pipe 7. Therefore, it is possible to suppress the liquid refrigerant pushed up into the first connection pipe 4 from being introduced into the expansion tank 6. Thereby, the expansion tank 6 can function more reliably.

Second Modified Example

Figure 5:
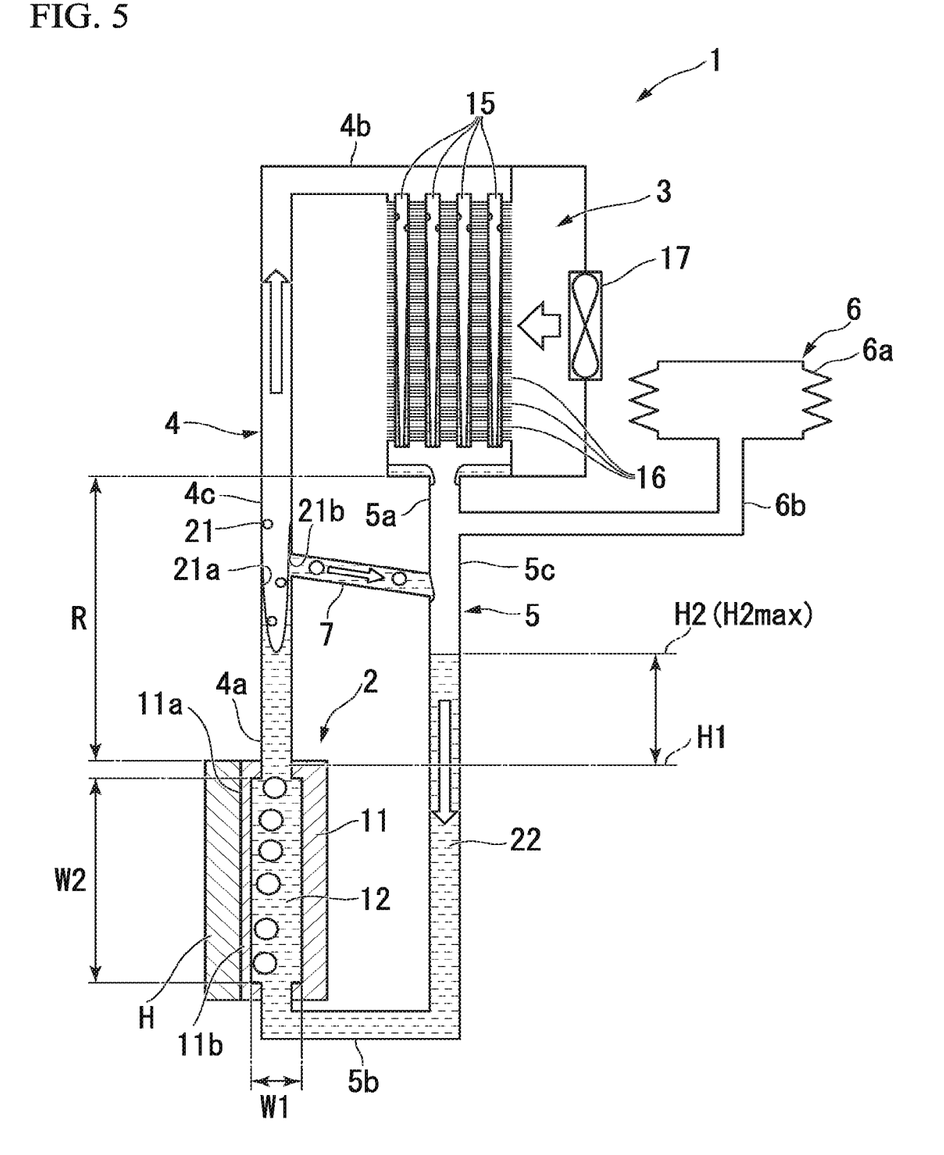
FIG. 5 is a cross-sectional view schematically showing a cooling device of a second modified example of the cooling device shown in FIG. 1.

FIG. 5 schematically shows the cooling device 1 of a second modified example. In the present modified example, a shape of the third connection pipe 7 is different from the above embodiment. Other configurations of the present modified example are the same as those of the above embodiment. Thus, description of parts similar to the above embodiment will be omitted.

As shown in FIG. 5, the third connection pipe 7 of the present modified example is diagonally inclined with respect to the horizontal direction. Specifically, the connection position between the third connection pipe 7 and the first connection pipe 4 is higher than the connection position between the third connection pipe 7 and the second connection pipe 5. The third connection pipe 7 is inclined such that its position is lowered from the first connection pipe 4 toward the second connection pipe 5. However, in the present modified example, the connection position between the third connection pipe 7 and the first connection pipe 4 is higher than the maximum liquid level height H2max of the refrigerant in the second connection pipe 5 when the cooling device 1 is in operation, as in the above embodiment.

According to such a configuration, the liquid refrigerant introduced into the third connection pipe 7 can be more smoothly introduced into the second connection pipe 5. In addition, according to the above configuration, the refrigerant in the second connection pipe 5 cannot easily flow backward to the first connection pipe 4 through the third connection pipe 7. Therefore, according to the above configuration, it is possible to further suppress degradation of the cooling performance of the cooling device 1.

Third Modified Example

FIG. 6 schematically shows the cooling device 1 of a third modified example. The present modified example differs from the second modified example described above in that the connection position between the third connection pipe 7 and the second connection pipe 5 is lower than the liquid level height H2 of the refrigerant in the second connection pipe 5. Other configurations of the present modified example are the same as those of the second modified example described above. Thus, description of parts similar to the above embodiment and the second modified example will be omitted.

As shown in FIG. 6, the third connection pipe 7 of the present modified example is inclined such that its position is lowered from the first connection pipe 4 toward the second connection pipe 5 as in the second modified example.

The connection position between the third connection pipe 7 and the first connection pipe 4 is higher than the maximum liquid level height H2max of the refrigerant in the second connection pipe 5 during the operation as in the above-described embodiment.

On the other hand, the connection position between the third connection pipe 7 and the second connection pipe 5 is lower than the maximum liquid level height H2max of the refrigerant in the second connection pipe 5 when the cooling device 1 is in operation. Further, the connection position between the third connection pipe 7 and the second connection pipe 5 may be lower than the liquid level height H2 in the second connection pipe 5 when the cooling device 1 is stopped.

Even according to such a configuration, as in the second modified example, the liquid refrigerant pushed up into the first connection pipe 4 can be returned to the evaporator 2 through the third connection pipe 7 and the second connection pipe 5. Therefore, even with the above configuration, it is possible to suppress degradation of the cooling performance of the cooling device 1.

Fourth Modified Example

Figure 7:
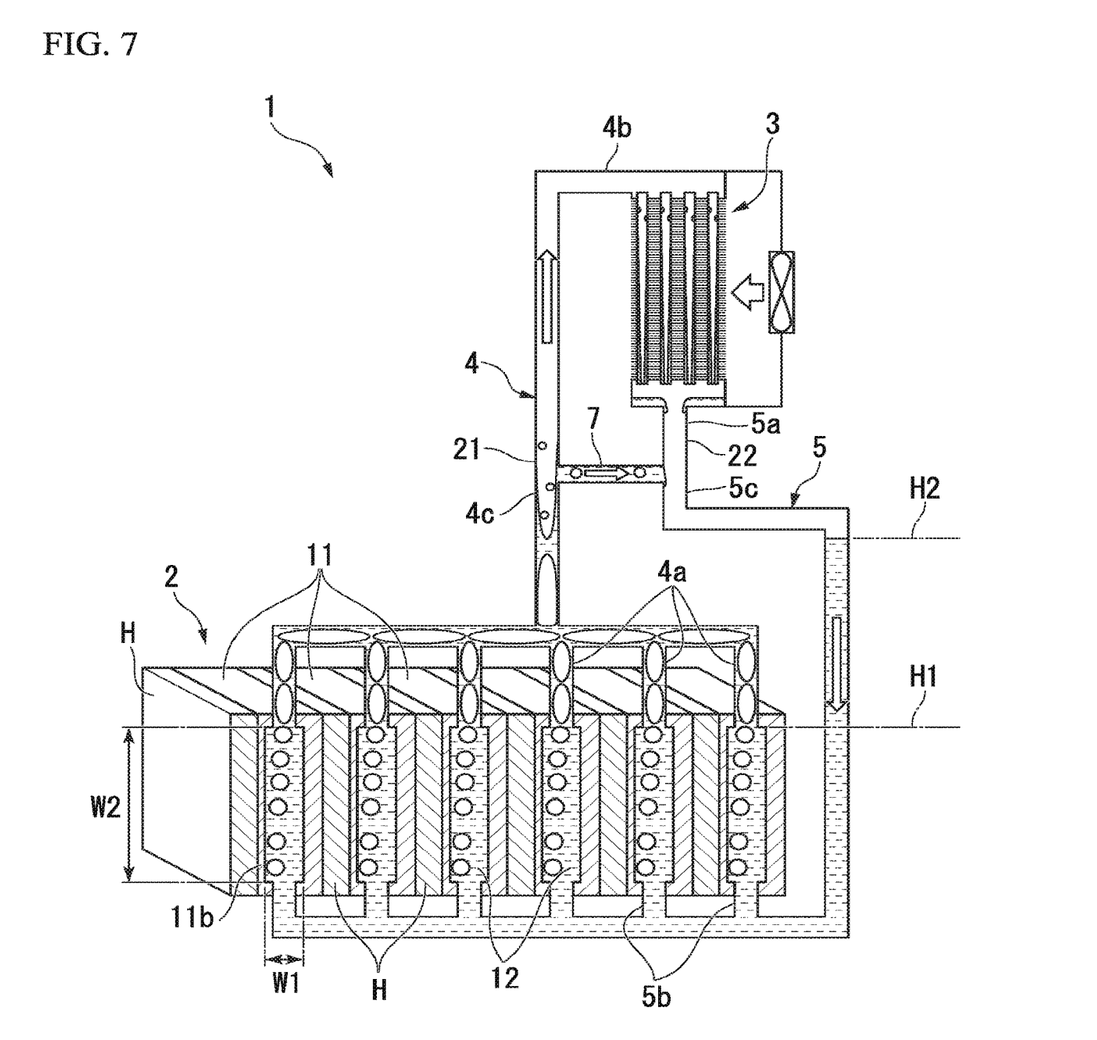
FIG. 7 is a cross-sectional view schematically showing a cooling device of a fourth modified example of the cooling device shown in FIG. 1.

FIG. 7 schematically shows the cooling device 1 of a fourth modified example. In the present modified example, a configuration of the evaporator 2 is different from the above embodiment. Other configurations of the present modified example are the same as those of the above embodiment. Thus, description of parts similar to the above embodiment will be omitted.

As shown in FIG. 7, in the present modified example, there are a plurality of heating elements H. The evaporator 2 includes a plurality of cases 11 that can be alternately disposed with the plurality of heating elements H in the horizontal direction. Each of the cases 11 is thermally connected to one of the heating elements H. Each case 11 has the space 12.

As shown in FIG. 7, each case 11 is a vertical type case as in the above embodiment. That is, in each case 11, the width W1 of the space 12 in the horizontal direction that is a direction in which the heating element H and the case 11 are arranged is smaller than the width W2 of the space 12 in the vertical direction.

The first connection pipe 4 includes a plurality of branch pipes 4a divided into the same number as the plurality of cases 11. Each of the branch pipes 4a communicates with the upper end portion of the space 12 of one of the cases 11. The branch pipes 4a are connected to the plurality of cases 11 at substantially the same height. The plurality of branch pipes 4a are an example of "the first end portion" of the first connection pipe 4.

Similarly, the second connection pipe 5 includes a plurality of branch pipes 5b divided into the same number as the plurality of cases 11. Each of the branch pipes 5b communicates with the lower end portion of the space 12 of one of the cases 11. The branch pipes 5b are connected to the plurality of cases 11 at substantially the same height. The plurality of branch pipes 5b are an example of "the second end portion" of the second connection pipe 5.

According to such a configuration, the same driving force based on a difference between the liquid level height H2 of the refrigerant in the second connection pipe 5 and the liquid level height H1 of the refrigerant in the first connection pipe 4 can be applied to the spaces 12 of the plurality of cases 11.

Even according to such a configuration, as in the above-described embodiment, it is possible to suppress degradation of the cooling performance of the cooling device 1.

Here, a case in which the heating element H and the case 11 are laid horizontally and the case 11 is placed on the heating element H (so-called horizontal type) is considered. In this case, even when the amount of the liquid refrigerant is reduced in the space 12 of the case 11, the entire area of the heating element H can be covered by the refrigerant. Therefore, when the case 11 is horizontally placed, degradation of the cooling performance due to depletion of the refrigerant cannot easily occur.

Here, in a case in which the evaporator 2 has the plurality of cases 11, when the plurality of horizontal type cases 11 are arranged in the vertical direction, the installation area is reduced. However, when the plurality of horizontal type cases 11 are arranged in the substantially vertical direction, since a difference occurs in the driving force of the liquid refrigerant supplied to each case 11, the cooling performance of each case 11 becomes non-uniform.

On the other hand, when the plurality of horizontal type cases 11 are arranged in the horizontal direction, the installation area increases while the cooling performance of each case 11 becomes uniform.

Therefore, in the present modified example, since the plurality of cases 11 are vertically placed, equalized cooling performance for each case 11 and reduced installation area are simultaneously implemented. Further, in the present modified example, since the third connection pipe 7 is provided, it is possible to suppress degradation of the cooling performance due to depletion of the refrigerant. Thereby, it is possible to provide the cooling device 1 which is small in size and capable of exhibiting excellent performance.

According to at least one embodiment described above, the cooling device includes an evaporator, a condenser, a first connection pipe, a second connection pipe, and a third connection pipe. In the evaporator, a refrigerant is vaporized by heat generated by a heating element. The condenser is located above the evaporator. In the condenser, the vaporized refrigerant is condensed by exchanging heat with an external fluid. The first connection pipe includes a first end portion communicating with the evaporator and a second end portion communicating with the condenser, and guides the refrigerant vaporized in the evaporator to the condenser. The second connection pipe includes a first end portion communicating with the condenser and a second end portion communicating with the evaporator, and guides the refrigerant condensed in the condenser to the evaporator. The third connection pipe connects a portion of the first connection pipe positioned between the first end portion and the second end portion of the first connection pipe and a portion of the second connection pipe positioned between the first end portion and the second end portion of the second connection pipe. In the third connection pipe, a connection position between the third connection pipe and the first connection pipe is higher than a maximum liquid level height of the refrigerant in the second connection pipe during an operation. According to such a configuration, it is possible to suppress degradation of the cooling performance of the cooling device.

While certain embodiments of the invention have been described, these embodiments have been presented by way of example only, and are not intended to limit the scope of the inventions. Indeed, these embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cooling device comprising:
an evaporator in which a refrigerant is vaporized by heat generated by a heating element;
a condenser which is located above the evaporator and in which the vaporized refrigerant is condensed by exchanging heat with an external fluid, the condenser comprising a plurality of cooling pipes into which the vaporized refrigerant is divided to be introduced;
a first connection pipe which comprises a first end portion communicating with the evaporator and a second end portion communicating with the condenser, and which guides the refrigerant vaporized in the evaporator to the condenser;
a second connection pipe which comprises a first end portion communicating with the condenser and a second end portion communicating with the evaporator, and which guides the refrigerant condensed in the condenser to the evaporator, wherein the second connection pipe is free of any check valve; and
only one third connection pipe connecting a portion of the first connection pipe positioned between the first end portion and the second end portion of the first connection pipe and a portion of the second connection pipe positioned between the first end portion and the second end portion of the second connection pipe, wherein
the first connection pipe comprises an upward piping portion, the upward piping portion having an inner circumferential surface and extending upward, the inner circumferential surface having an opening which is opened to a side of the upward piping portion, and
the only one third connection pipe is configured to provide a single fluid flow path, the only one third connection pipe is connected to the opening of the upward piping portion, the only one third connection pipe has an inner diameter which is larger than a minimum inner diameter of each of the plurality of cooling pipes, the upward piping portion of the first connection pipe is free of any connection branch for providing a fluid flow path other than the only one third connection pipe for allowing some liquid part of the refrigerant which is pushed toward the inner circumferential surface of the upward piping portion and is raised in the upward piping portion while being in contact with the inner circumferential surface by a vapored part of the refrigerant which is vaporized in the evaporator to be pushed into the only one third connection pipe when the some liquid part of the refrigerant reaches the opening.

2. The cooling device according to claim 1, wherein a connection position between the only one third connection pipe and the second connection pipe is lower than the condenser.

3. The cooling device according to claim 1, further comprising:
a tank which is connected to the second connection pipe at a position lower than the condenser, and which is expandable according to pressure inside the second connection pipe,
wherein
a connection position between the only one third connection pipe and the second connection pipe is lower than a connection position between the tank and the second connection pipe.

4. The cooling device according to claim 1, further comprising a plurality of heating elements including the heating element,
wherein:
the evaporator comprises a plurality of cases which are configured to be alternately disposed with the plurality of heating elements in a horizontal direction, and each of the plurality of cases includes a space which is configured to accommodate the refrigerant;
the first connection pipe communicates with an upper end portion of the space of each of the plurality of cases;
the second connection pipe communicates with a lower end portion of the space of each of the plurality of cases; and
a width of the space in a horizontal direction in which the plurality of heating elements and the plurality of cases are arranged is smaller than a width of the space in a substantially vertical direction, in regard to each of the plurality of cases.

5. The cooling device according to claim 1, wherein the opening is provided in a middle part of the upward piping portion.

6. The cooling device according to claim 1, wherein the upward piping portion extends in a substantially vertical direction.

7. The cooling device according to claim 1, wherein the opening is opened in a radial direction of the upward piping portion.

8. A cooling device comprising:
an evaporator in which a refrigerant is vaporized by heat generated by a heating element;
a condenser which is located above the evaporator and in which the vaporized refrigerant is condensed by exchanging heat with an external fluid, the condenser comprising a plurality of cooling pipes into which the vaporized refrigerant is divided to be introduced;
a first connection pipe which comprises a first end portion communicating with the evaporator and a second end portion communicating with the condenser, and which guides the refrigerant vaporized in the evaporator to the condenser;
a second connection pipe which comprises a first end portion communicating with the condenser and a second end portion communicating with the evaporator, and which guides the refrigerant condensed in the condenser to the evaporator, wherein the second connection pipe is free of any check valve; and only one third connection pipe connecting a portion of the first connection pipe positioned between the first end portion and the second end portion of the first connection pipe and a portion of the second connection pipe positioned between the first end portion and the second end portion of the second connection pipe, wherein
the first connection pipe comprises an upward piping portion, the upward piping portion having an inner circumferential surface and extending upward in a substantially vertical direction, the inner circumferential surface having an opening which is opened in a radial direction of the upward piping portion, and
the only one third connection pipe is configured to provide a single fluid flow path, the only one third connection pipe is connected to the opening of the upward piping portion and communicates with an inside of the upward piping portion, the only one third connection pipe has an inner diameter which is larger than a minimum inner diameter of each of the plurality of cooling pipes, and the upward piping portion of the first connection pipe is free of any connection branch for providing a fluid flow path other than the only one third connection pipe.

9. The cooling device according to claim 8, wherein the opening is provided in a middle part of the upward piping portion.

10. The cooling device according to claim 1, wherein the inner diameter of the only one third connection pipe is larger than a maximum inner diameter of each of the plurality of cooling pipes.

11. The cooling device according to claim 1, wherein each of the plurality of cooling pipes extends in a substantially vertical direction, and an inner diameter of a lower end portion of each of the plurality of cooling pipes is larger than an inner diameter of an upper end portion of each of the plurality of cooling pipes, and
the inner diameter of the only one third connection pipe is larger than the inner diameter of the lower end portion of each of the plurality of cooling pipes.

12. The cooling device according to claim 11, wherein the inner diameter of the only one third connection pipe is larger than the inner diameter of the upper end portion of each of the plurality of cooling pipes.

13. The cooling device according to claim 8, wherein the inner diameter of the only one third connection pipe is larger than a maximum inner diameter of each of the plurality of cooling pipes.

14. The cooling device according to claim 8, wherein each of the plurality of cooling pipes extends in the substantially vertical direction, and an inner diameter of a lower end portion of each of the plurality of cooling pipes is larger than an inner diameter of an upper end portion of each of the plurality of cooling pipes, and
the inner diameter of the only one third connection pipe is larger than the inner diameter of the lower end portion of each of the plurality of cooling pipes.

15. The cooling device according to claim 14, wherein the inner diameter of the only one third connection pipe is larger than the inner diameter of the upper end portion of each of the plurality of cooling pipes.

* * * * *